United States Patent
Kinsman et al.

(10) Patent No.: US 6,268,650 B1
(45) Date of Patent: Jul. 31, 2001

(54) SEMICONDUCTOR DEVICE, BALL GRID ARRAY CONNECTION SYSTEM, AND METHOD OF MAKING

(75) Inventors: Larry D. Kinsman; Salman Akram, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/317,957

(22) Filed: May 25, 1999

(51) Int. Cl.[7] ................................................ H01L 23/52
(52) U.S. Cl. .................... 257/691; 257/692; 257/698; 257/678; 257/690; 257/685
(58) Field of Search ................................ 257/780, 691, 257/706, 778, 692, 698, 729, 786, 678, 690, 685

(56) References Cited

U.S. PATENT DOCUMENTS

| | | | |
|---|---|---|---|
| 4,951,123 | 8/1990 | Lee et al. ............................ 357/81 |
| 5,155,067 | 10/1992 | Wood et al. ....................... 437/209 |
| 5,677,566 | 10/1997 | King et al. ........................ 257/666 |
| 5,696,033 | 12/1997 | Kinsman .......................... 437/217 |
| 5,736,456 | 4/1998 | Akram ............................. 438/614 |
| 5,739,585 | 4/1998 | Akram et al. .................... 257/698 |
| 5,789,803 | 8/1998 | Kinsman ........................... 257/666 |
| 5,817,535 | 10/1998 | Akram ................................ 438/15 |
| 5,849,635 | 12/1998 | Akram et al. ..................... 438/704 |
| 5,895,967 | * 4/1999 | Stearns et al. .................... 257/691 |
| 6,060,774 | * 5/2000 | Terui ................................. 257/692 |
| 6,091,140 | * 7/2000 | Toh et al. .......................... 257/691 |

OTHER PUBLICATIONS

R.D. Schueller, Advanced Packing, Meeting performance and reliability criteria, May 1998, pp 28–34.

* cited by examiner

*Primary Examiner*—Caridad Everhart
*Assistant Examiner*—V. Yevsikov
(74) *Attorney, Agent, or Firm*—Dickstein Shapiro Morin & Oshinsky LLP

(57) ABSTRACT

A taped ball grid array (BGA) semiconductor device is provided with a metal stiffening layer between the die and the resin tape material. The metal layer is used as an electrical ground plane to simplify the routing pattern of conductive traces on the tape. The metal layer may also be used to dissipate heat from the die. Wires may be employed to connect the die to the conductive traces and to the metal ground plane. Improved structural, thermal and/or electrical performance may be enhanced without substantially increasing the lateral or vertical dimensions of the device. In addition, the device may be produced according to a tape-based manufacturing process.

34 Claims, 3 Drawing Sheets

SEMICONDUCTOR DEVICE, BALL GRID ARRAY CONNECTION SYSTEM, AND METHOD OF MAKING

BACKGROUND OF THE INVENTION

1. Field of the Invention

The present invention relates generally to structures for providing electrical connections and/or interconnections for semiconductor devices. More particularly, the invention relates to ball grid array (BGA) packages, and conductive structures for connecting integrated circuits to ball grid arrays, including tine ball grid arrays (FBGA). The present invention also relates to methods of making electronic devices and the like, particularly tape-based methods of manufacturing semiconductor devices.

2. Discussion of the Related Art

Ball grid array packages are known in the art. In one such product, a resin material is located on the active surface of a semiconductor die. Solder balls are formed on top of the resin material. Wires connect the bond pads on the die to conductive traces patterned on the resin material. The wires extend through an opening in the resin material. The traces communicate signals from the wires to the solder balls. The resin material may be cut from a continuous tape after the device is otherwise assembled, according to a known tape-based manufacturing method.

The known devices and manufacturing processes have several disadvantages. Among other things, it would be advantageous to incorporate a stiffening or reinforcing structure into the ball grid array package described above without substantially increasing its overall size. The desired structure would produce a durable, easier to handle product, and it would make it practicable to employ thinner and/or more flexible material for the tape.

In addition, it would be advantageous to provide a means for dissipating or distributing heat from the semiconductor die without substantially increasing the size or complexity of the device.

In addition, as the size of ball grid array devices are reduced and the number and complexity of the required electrical interconnections are increased, it becomes increasingly difficult to produce a satisfactory conductive routing pattern on the resin material. Thus, it would be advantageous to provide a system for connecting the die to the ball grid array with a simplified conductive routine pattern.

SUMMARY OF THE INVENTION

The disadvantages of the prior art are overcome to a great extent by the present invention. The present invention relates to a semiconductor device with improved structural, thermal and/or electrical performance characteristics. The present invention also relates to a method of packaging a semiconductor die for use with an external device such as a circuit board.

According to one aspect of the invention, a device is formed of a semiconductor die, a ball grid array for communicating with an external device (such as a circuit board), and an electrically insulative layer. The insulative layer supports the ball grid array. That is, the insulative layer is located between the ball grid array and the die. An electrically conductive layer is located between the insulative layer and the die. The conductive layer, which may be made of metal, provides structural support (stiffness) and also dissipates heat away from the die. An adhesive layer may be located between the conductive layer and the semiconductor die. The ball grid array is electrically connected to the die by wires, traces and/or other conductive elements. At least some of these elements are also connected to the conductive layer, consequently, the conductive layer may be used as a common ground plane.

According to another aspect of the invention, open areas are provided in the metal layer and the insulative layer to accommodate metal wires that are connected to the active surface of the die.

According to another aspect of the invention, the insulative layer may be cut from a tape structure. Conductive traces are patterned on the tape to route signals to the ball grid array. Some of the wires attached to the die are also attached to the conductive traces. Other wires may be attached to the metal ground plane and are insulated from the traces.

One or more via holes may be provided to connect the metal ground plane to the desired one or more balls of the ball grid array.

In a preferred embodiment of the invention, the fragile conductive elements are glob top encapsulated in resin. Other packaging techniques may also be employed, if desired.

According to another aspect of the invention, an electronic device is formed of a semiconductor die, a patterned film, and a metal grounding layer. The metal layer is located between the die and the patterned film. The film has electrical conductors (for example, conductive traces, via holes and solder balls) for providing communication between the die and an external device. An advantage of the invention is that the package containing the die may have a small footprint and reduced height, if desired.

The present invention may be employed with a die that has centrally located bond pads. In addition, the invention may be used in perimeter pad devices. Thus, the metal layer may have a smaller surface area than the die. In another embodiment of the invention, the metal layer has peripheral portions that extend laterally outwardly beyond the edges of the die, for example to provide room for additional rows of solder balls and/or to provide increased heat dissipation. In another embodiment of the invention, the metal layer has a recess that receives or contains the die to provide increased stiffness, protection and/or heat dissipation. The present invention is not limited to the preferred embodiments described herein.

The invention also relates to a tape-based process for producing semiconductor devices. In a preferred embodiment of the invention, a tape structure is formed of electrically insulative tape, a succession of semiconductor dies attached to the tape, and stiff metal grounding layers. The metal layers are located between the dies and the tape. A corresponding Succession of ball grid arrays, wires, or other electrical connection systems, may be located on the tape. Thus, according to the invention, semiconductor devices, workpieces and/or electronic components may be formed according to a tape-based process and subsequently separated from each other.

These and other features and advantages will become apparent from the following detailed description of preferred embodiments of the invention.

BRIEF DESCRIPTION OF HE DRAWINGS

DETAILED DESCRIPTION OF PREFERRED EMBODIMENTS

Figure 1:
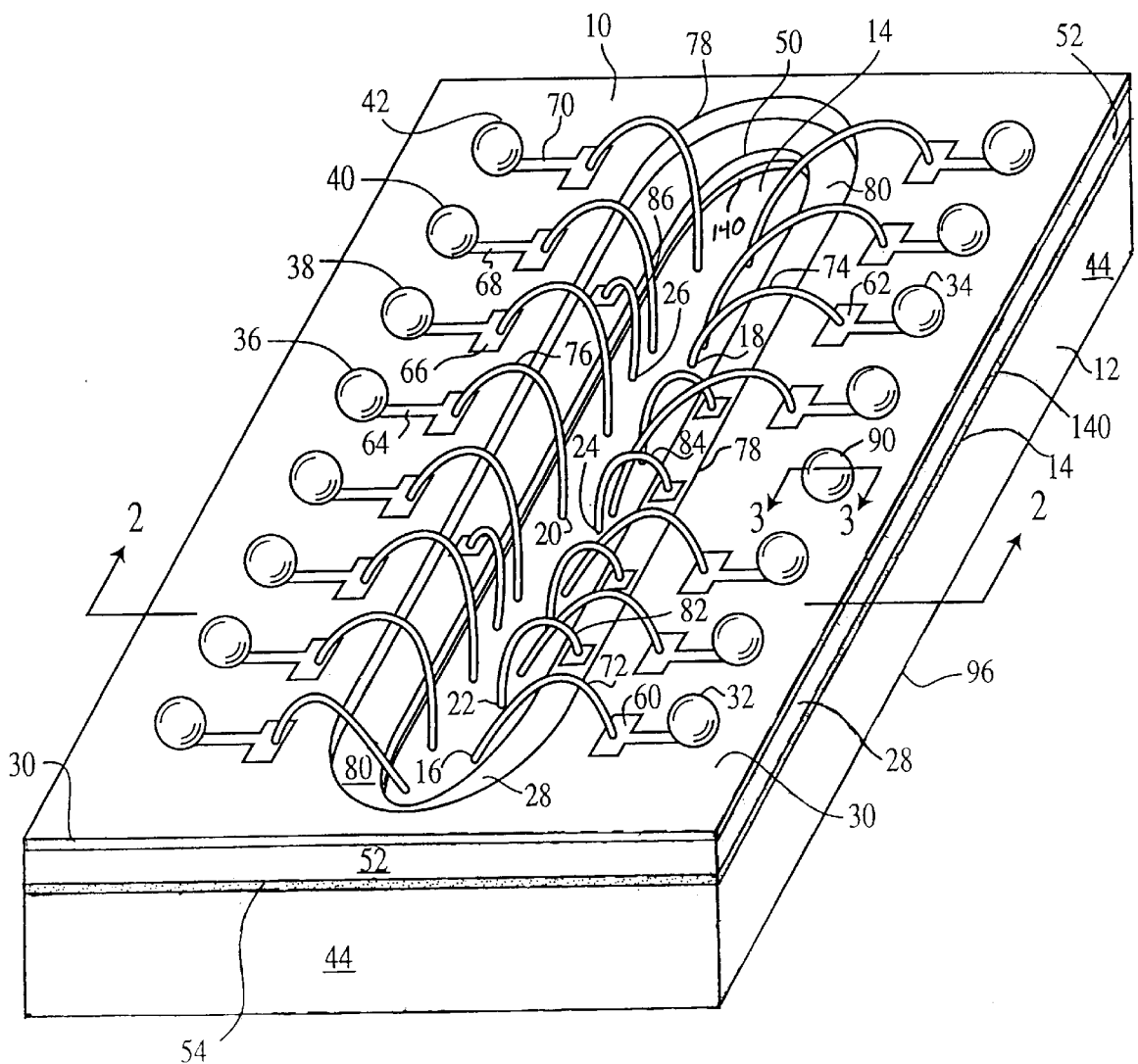
FIG. 1 is an isometric view of a semiconductor package constructed in accordance with a preferred embodiment of the present invention.

Referring now to the drawings, where like reference numerals refer to like elements, there is shown in FIG. 1 a board-on-chip (BOC) semiconductor device 10 constructed in accordance with the present invention. The device 10 has a semiconductor die 12 with an active top surface 14. The die 12 contains an integrated circuit (not shown). The integrated circuit is in electrical communication with bond pads 16, 18, 20, 22, 24, 26 on the active surface 14.

An electrically conductive layer 28 is located on the active surface 14. The conductive layer 28 may be formed of a stiff metal material. An electrically insulative plastic film (or laminate) 30 is located on the metal layer 28. A ball grid array (BGA) is located on the plastic layer 30. The illustrated ball grid array is formed of two rows of minute solder balls 32, 34, 36, 38, 40, 42. In alternative embodiments of the invention, the solder balls may be arranged in one row or more than two rows, or the balls may be provided in non-linear arrangements (not illustrated). In a preferred embodiment of the invention, the solder balls 32–42 form a fine pitch ball grid array (FBGA). The balls 32–42 may be formed of tin (Sn) and/or lead (Pb), for example.

An adhesive layer 140 may be located between the active surface 14 and the electrically conductive layer 28. The adhesive layer 140 provides an adhesive connection between the semiconductor die and the conductive layer 28. The adhesive layer 140 may be formed of a variety of suitable materials, including thermoplastic and thermoset type adhesive materials.

An advantage of the invention is that the ball grid array 32–42 may be located entirely within (or at least near) the periphery 44 of the semiconductor die 12. Thus, the present invention may be used to provide a semiconductor package that has a small footprint. The device 10 may occupy a reduced area on a circuit board, for example. This advantage is achieved, according to one aspect of the invention, by locating the metal layer 28 directly between the semiconductor die 12 and the plastic film 30.

In the illustrated embodiment, the metal layer 28 and the adhesive layer 140 are coextensive with the active surface 14 of the semiconductor die 12, except for an open area 50 over the bond pads 16–26. That is, the peripheral edges 52 of the metal layer 28 may be aligned with the peripheral edges 44 of the semiconductor die 12. The metal layer 28 is preferably in direct, intimate contact with the adhesive layer 140. In the illustrated embodiment, the metal layer 28 extends continuously across the semiconductor active surface 14 (except for the open area 50). This way, the metal layer 28 forms an effective heat sink at its interface 54 with the die 12 to spread and/or dissipate heat from localized hot spots on the active surface 14. In the illustrated embodiment, the thin adhesive layer 140 does not prevent heat from dissipating from the active surface 14 to the metal layer 28.

Electrically conductive traces 60, 62, 64, 66, 68, 70 are patterned on the plastic film 30. The traces 60–70 are electrically connected to the respective balls 32–42 of the ball grid array. The traces 60–70 may be formed for example by depositing copper or aluminum in the desired pattern on the plastic film 30. A first group of metal wires 72, 74, 76 are attached to a corresponding group of bond pads 16, 18, 20, to electrically connect those bond pads 16–18 to respective solder balls 32, 34, 36. The wires 72–76 may be formed for example by a known leads-on-clip (LOC) wire bonding machine. An open area 78 is defined in a central portion of the plastic film 30. The open area 78 may be concentric with the open area 50 of the metal layer 28 and the bond pad portion of the active surface 14. The wires 72–76 extend through the aligned open areas 78, 50.

Figure 3:
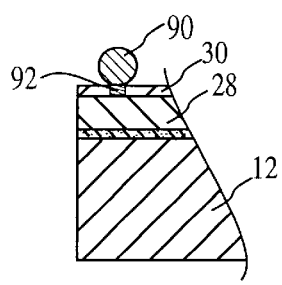
FIG. 3 is a cross sectional view of the semiconductor package of FIG. 1, taken along the line 3—3.

The open area 78 of the plastic film 30 may be larger than the open area 50 of the metal layer 28 to leave an exposed metal region (an inner bondable metal surface) 80. A second group of metal wires 82, 84, 86 are attached to and provide electrical communication between a second group of bond pads 22–26 and the exposed region 80 of the metal layer 28. Appropriate wire bondable regions for providing electrical connections to the metal wires 82–86 may be formed of gold plate, silver plate or other suitable materials. Thus, the metal layer 28 forms a ground plane for the second group of bond pads 22–26. As shown in FIG. 3, the metal layer (ground plane) 28 may be electrically connected to one of the solder balls 90 through a via hole 92 formed in the plastic film 30. In an alternative embodiment of the invention, the metal layer 28 may be connected to the grounded ball 90 by a suitable wire.

By utilizing the metal ground plane 28 connected to one or more of the solder balls 90, the routing pattern of the traces 60–70 On the plastic film 30 may be simplified. The grounded solder ball 90 may be connected to an external ground when the device 10 is installed in a larger device, such as a circuit board (not illustrated).

Figure 2:
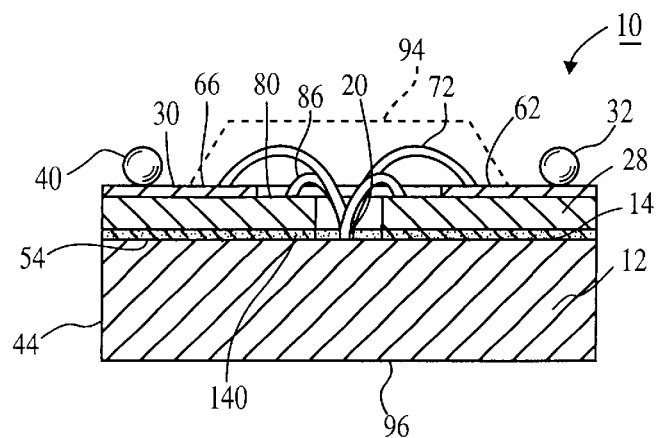
FIG. 2 is a cross sectional view of the semiconductor package of FIG. 1, taken along the line 2—2.

If desired, the wires 72–76, 82–86 and the bond pads 16–26 may be glob top encapsulated in a suitable resin 94. The encapsulant resin 94 is shown in dashed lines in FIG. 2. The resin 94 is not shown in FIG. 1 for the sake of clarity of illustration. In an alternative embodiment of the invention, the resin 94 may be formed by a transfer molding process. The transfer molded material may be a silica filled epoxy molding compound, for example. In yet another embodiment of the invention, the wires 72–76, 82–86 and the bond pads 16–26 may be covered by a pre-molded or stamped lid (not illustrated). The lid may be adhered by glue at the desired location. The present invention should not be limited to the specific embodiments shown and described in detail herein.

In a preferred embodiment of the invention, the metal layer 28 may be used to provide the desired stiffness for the finished device 10. The metal layer 28 is preferably adhered to the plastic film 30. According to one aspect of the invention, there is no need for a metal layer or any other stiffening structure on the bottom surface 96 of the semiconductor die 12. Eliminating the need for a metal layer on the bottom 96 of the die 12 contributes to a package with a low profile in the vertical (top-to-bottom) direction. The stiffness provided by the metal layer 28 (between the die 12 and the plastic film 30) makes it easier to handle the patterned film 30 without creating defects in the device 10. At the same time, the electrical connections provided by the metal layer (ground plane) 28 reduce the complexity of the routing of the traces 60–70, all of which provide for a robust packaging process with fewer defects.

Figure 4:
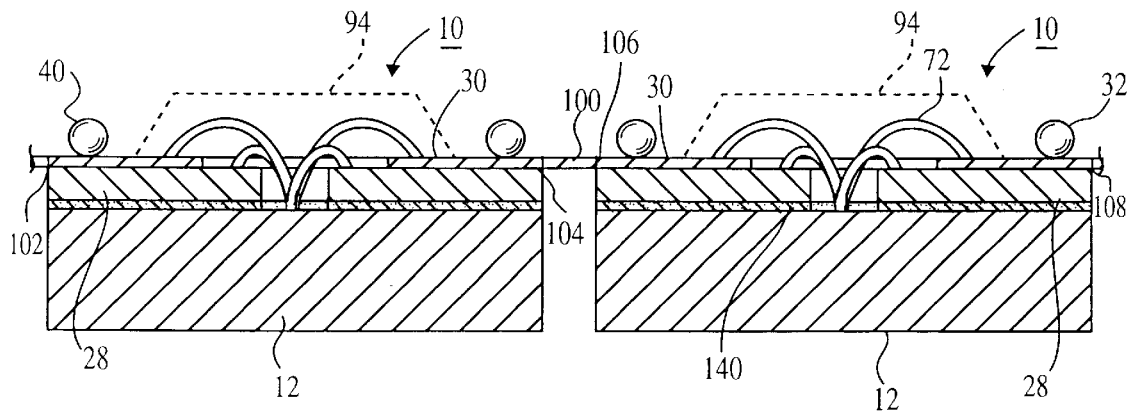
FIG. 4 is a cross sectional view like FIG. 2, showing the semiconductor package as part of a tape structure at an intermediate stage of production.

Referring now to FIG. 4, a plurality of semiconductor devices 10 may be formed as a tape structure and subsequently separated from each other. In the illustrated embodiment, the tape structure has an indefinite length plastic tape 100 that is subsequently cut along lines 102, 104, 106, 108 to separate the devices 10 from each other. Metal layers 28 are connected to the flexible tape 100 at spaced apart locations. Since the tape 100 is reinforced by the metal layers 28, the tape 100 may be formed of flexible materials, such as thin films of UPLEX or KAPTON brand polyimide materials. Alternatively, the tape 100 may be formed of a known BT resin and/or a glass impregnated FR4 material. In another embodiment of the invention, the tape structure may be formed of a strip of metal with patches of tape at the sites where the devices 10 are located.

Semiconductor dies 12 may be adhered to the metal layers 28 before or after the metal layers 28 are adhered to the tape 100. After the metal layers 28 are connected to the tape 100, the wires 72–76, 82–86 are connected to the bond pads 16–26, the patterned traces 60–70 and the bond locations on the exposed region 80 of the metal layer 28. The solder balls 32–42, 90 are placed on the tape 100, and the glob top encapsulant resin 94 is applied by a known technique. Subsequently, the tape 100 is cut at the lines 102–108 to produce individual packaged semiconductor devices.

Figure 5:
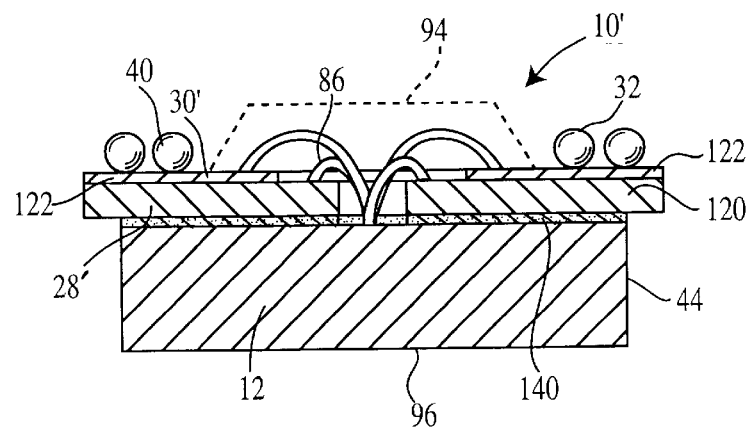
FIG. 5 is a cross sectional view of another semiconductor package constructed in accordance with the present invention.

Referring now to FIG. 5, the metal layer 28' and plastic film 30' may be provided with peripheral portions 120, 122 that extend laterally outwardly beyond the peripheral edges 44 of the semiconductor die 12. The illustrated arrangement may be useful where additional area on top of the plastic film 30' is desired to conveniently fit all of the solder balls 32–42, 90 in the desired positions for communication with one or more external devices.

Figure 6:
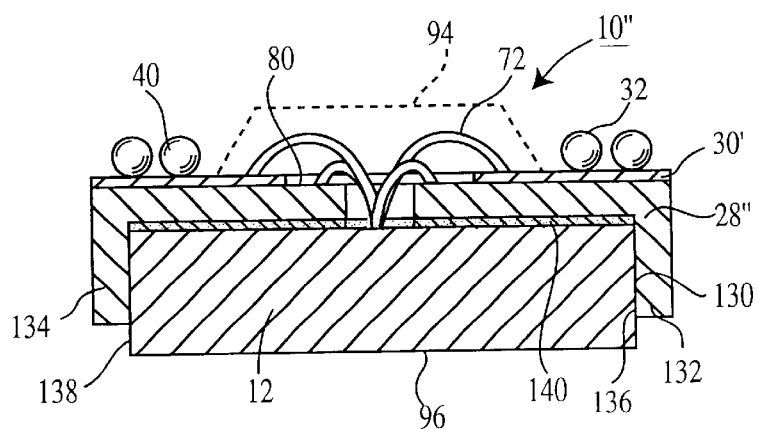
FIG. 6 is a cross sectional view of yet another semiconductor package constructed in accordance with the present invention.

FIG. 6 shows another device 10" constructed in accordance with the present invention. The metal layer 28" for the illustrated device 10" has a recess 130. The semiconductor die 12 fits into the recess 130. The device 10" may have improved stiffness provided by the metal 132, 134 integrally formed on the sides 136, 138 of the die 12, without increasing the overall vertical height of the finished product. In addition, the recess 130 may be useful for absorbing heat from the sides 136, 138 of the die 12.

Figure 7:
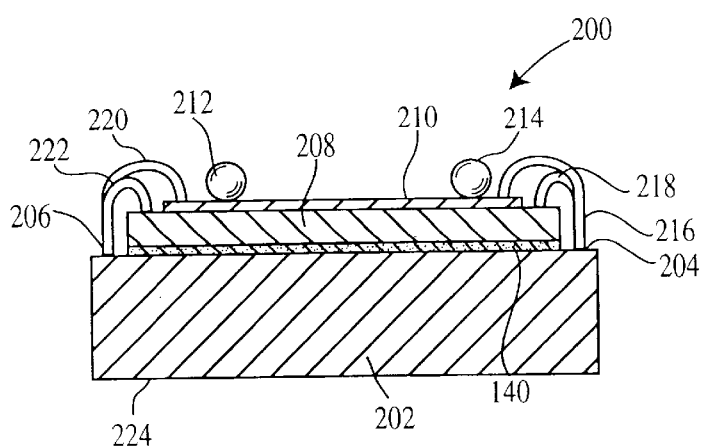
FIG. 7 is a cross sectional view of yet another semiconductor package constructed in accordance with the present invention.

The present invention is not limited to the preferred embodiments shown and described herein. FIG. 7 illustrates, for example, how the invention may be used to construct a ball grid array device 200 with a perimeter pad design. The illustrated device 200 has a semiconductor die 202 with numerous peripheral bond pads 204, 206, only two of which are identified in the drawings. A metal layer 208 is formed on the active top surface of the semiconductor die 202. The metal layer 208 does not cover the bond pads 204, 206.

A plastic resin layer 210 is adhered to the metal layer 208. The plastic layer 210 may have conductive traces and solder balls 212, 214 formed therein similar to the arrangements shown in FIGS. 1–6. Wires 216, 218, 220, 222 selectively connect the bond pads 204, 206 to the metal layer 208 and the traces connected to the solder balls 212, 214. The electrical connections are similar to those shown in FIGS. 1–6 except that the wires 216–222 extend inwardly from the periphery of the die 202, rather than outwardly from the center thereof.

Like the metal layer 28 discussed above, the metal layer 208 of the FIG. 7 device 200 may perform the multiple functions of stiffening the product, serving as a heat sink for the semiconductor die 202, and providing an electrical ground plane to reduce the complexity of the routing for the traces on the plastic film 210. The metal layer 208 performs these functions in a product 200 that has a relatively small footprint (an area less than that of the die 202) and a low vertical profile. The FIG. 7 device 200 does not require a metal layer under the bottom surface 224 of the die 202.

What is claimed as new and desired to be protected by Letters Patent of the United States is:

1. A board-on-chip semiconductor device, comprising:
   a semiconductor die;
   a ball grid array located in a board-on-chip arrangement for communicating with an external device, wherein said ball rid array is supported by said semiconductor die;
   an electrically insulative layer located between said ball grid array and said semiconductor die;
   an electrically conductive layer located between said electrically insulative layer and said semiconductor die; and
   electrical conductors for connecting said ball grid array to said semiconductor die, and wherein at least some of said electrical conductors are connected to said electrically conductive layer.

2. The semiconductor device of claim 1, wherein said conductive layer includes metal.

3. The semiconductor device of claim 2, wherein said metal dissipates heat from said die.

4. The semiconductor device of claim 3, wherein said conductive layer provides stiffness to said semiconductor device.

5. The semiconductor device of claim 4, wherein said conductive layer defines an open area, and wherein at least some of said conductors extend through said area.

6. The semiconductor device of claim 1, wherein said conductors include metal wires.

7. The semiconductor device of claim 6, wherein said conductors include electrically conductive traces.

8. The semiconductor device of claim 7, wherein said traces are patterned on said insulative layer.

9. The semiconductor device of claim 8, wherein said wires are attached to said die.

10. The semiconductor device of claim 9, wherein a first group of said wires are attached to said traces.

11. The semiconductor device of claim 10, wherein a second group of said wires are attached to said conductive layer.

12. The semiconductor device of claim 1, wherein said insulative layer defines an open area, and wherein at least some of said conductors extend through said area.

13. The semiconductor device of claim 1, wherein said insulative layer defines a via hole, and wherein said ball grid array includes a solder ball electrically connected to said conductive layer through said via hole.

14. The semiconductor device of claim 1, further comprising resin material encapsulating said conductors.

15. A semiconductor package, comprising:
   a semiconductor die;
   a patterned film including electrical conductors for providing electrical communication with an external device; and
   a metal layer having first and second surfaces for grounding said semiconductor die, said metal layer being located between said semiconductor die and said patterned film so that said first surface of said metal layer is adhered to said semiconductor die and said second surface of said metal layer is adhered to said patterned films wherein said patterned film and said metal layer are supported by said semiconductor die.

16. The semiconductor package of claim 15, wherein said metal layer is electrically connected to said conductors.

17. The semiconductor package of claim 16, further comprising wires for connecting said die, said conductors, and said metal layer.

18. The semiconductor package of claim 17, wherein said conductors include electrically conductive traces, said traces being located on said film.

19. The semiconductor package of claim 18, further comprising a ball grid array for communicating with the external device, said ball grid array being connected to said traces.

20. The semiconductor package of claim 19, wherein said ball grid array is electrically connected to said metal layer.

21. The semiconductor package of claim 20, further comprising resin material encapsulating said conductors.

22. A semiconductor device comprising:
   a semiconductor die including an active surface and bond pads, said bond pads being located on said active surface;
   a conductive material layer adhered to said active surface of said semiconductor die, said conductive material layer being electrically connected to a first group of said bond pads on said active surface of said semiconductor die; and
   a ball grid array for communication with an external device, said ball grid array being electrically connected to a second group of said bond pads on said active surface of said semiconductor die, and
   wherein said conductive material layer provides stiffness and is located between said semiconductor die and said ball grid array, and said conductive material layer and said ball grid array are supported by said semiconductor die.

23. The device of claim 22, wherein said active surface has a central portion, said bond pads being located on said central portion.

24. The device of claim 23, wherein said ball grid array includes first and second groups of solder balls, and wherein said bond pads are located between said first and second groups.

25. The device of claim 24, wherein said conductive material layer defines an open area for receiving wires connected to said bond pads.

26. The device of claim 22, wherein said active surface has peripheral portions, said bond pads being located on said peripheral portions.

27. The device of claim 26, wherein said ball grid array is located between said peripheral portions.

28. The device of claim 22, wherein said conductive material dissipates heat from said die.

29. The device of claim 28, wherein said conductive material layer includes a layer of metal.

30. The device of claim 22, wherein said conductive material layer has portions extending laterally outward beyond the periphery of said die.

31. The device of claim 22, wherein said conductive material layer has a recess, said die being located in said recess.

32. A tape structure for producing semiconductor devices, said tape structure comprising:
   an electrically insulative tape;
   first and second semiconductor dies attached to said electrically insulative tape; and
   metal layers for stiffening and grounding said devices, said metal layers being located between said semiconductor dies and said electrically insulative tape, said semiconductor die being adhered to one side of said metal layers and said tape being adhered to an opposite side of said metal layers.

33. The tape structure of claim 32, further comprising ball grid arrays located on said tape.

34. The tape structure of claim 33, further comprising wires for connecting said dies to said metal layers and to said ball grid arrays.

* * * * *